United States Patent [19]

Mizutani

[11] Patent Number: 4,637,128
[45] Date of Patent: Jan. 20, 1987

[54] METHOD OF PRODUCING SEMICONDUCTOR DEVICE

[75] Inventor: Yoshihisa Mizutani, Tokyo, Japan

[73] Assignee: Kabushiki Kaisha Toshiba, Japan

[21] Appl. No.: 726,399

[22] Filed: Apr. 23, 1985

[30] Foreign Application Priority Data

Jun. 18, 1984 [JP] Japan ................... 59-124687

[51] Int. Cl.$^4$ ............... H01L 21/308; H01L 29/78
[52] U.S. Cl. .................................. 29/576 B; 29/571;
29/578; 29/580; 29/576 W; 148/1.5; 148/DIG.
82; 148/DIG. 85; 357/41; 357/49; 357/56;
156/649; 156/647
[58] Field of Search ............ 29/571, 576 B, 578,
29/580, 576 W, 579; 148/1.5, DIG. 50, DIG.
82, DIG. 85, DIG. 86, DIG. 109; 357/41, 49,
55, 56, 59; 156/649, 647

[56] References Cited

U.S. PATENT DOCUMENTS

| | | | |
|---|---|---|---|
| 4,268,951 | 5/1981 | Elliott et al. | 29/571 |
| 4,402,761 | 9/1983 | Feist | 29/571 X |
| 4,444,605 | 4/1984 | Slawinski | 29/571 X |
| 4,453,306 | 6/1984 | Lynch et al. | 29/571 |
| 4,455,193 | 6/1984 | Jeuch et al. | 29/571 X |
| 4,461,072 | 7/1984 | Wada et al. | 29/571 |
| 4,472,874 | 9/1984 | Kurosawa et al. | 29/571 X |
| 4,486,943 | 12/1984 | Ryden et al. | 29/571 |

*Primary Examiner*—Brian E. Hearn
*Assistant Examiner*—David A. Hey
*Attorney, Agent, or Firm*—Finnegan, Henderson, Farabow, Garrett & Dunner

[57] ABSTRACT

A method of producing a semiconductor device comprises an isolation step for forming an n-type region in contact with p$^+$-type source and drain regions of a p-channel floating gate MOS transistor in the surface area of an n-type semiconductor substrate and an n$^+$-type region in contact with the n-type region. In this isolation step, and oxidation resistant film pattern is formed on the element region of the MOS transistor. An anisotropic etching is applied to the substrate with the oxidation resistant film pattern used as a mask to form an inclined portion and a flat portion, followed by forming a SiO$_2$ film of a prescribed thickness to cover both the inclined and flat portions. Further, an n-type impurity is introduced by ion implantation into the substrate through the SiO$_2$ film in a direction perpendicular to the flat portion, followed by annealing the ion-implanted region.

12 Claims, 13 Drawing Figures

F I G. 4A
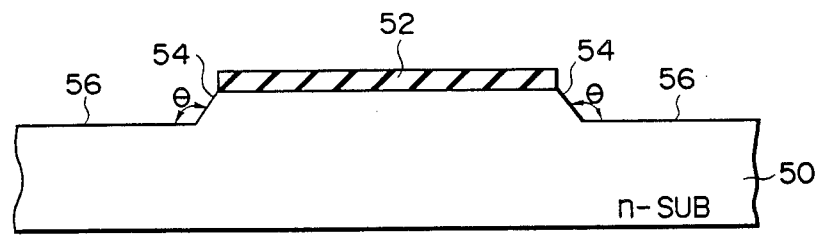
F I G. 4B
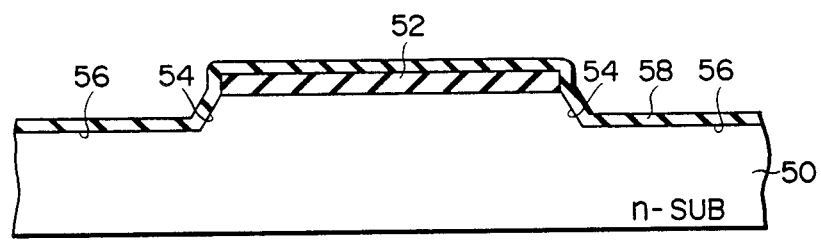
F I G. 4C
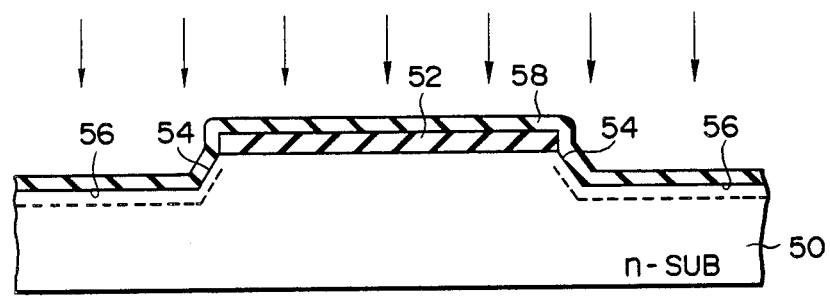

4,637,128

METHOD OF PRODUCING SEMICONDUCTOR DEVICE

BACKGROUND OF THE INVENTION

This invention relates to a method of producing a semiconductor device, particularly, to a method of electrically insulating a prescribed element region formed in a semiconductor substrate from other element regions.

Recently, memory cells of a semiconductor memory device tend to be very finely formed on a semiconductor substrate in order to increase the density of integration. The surface area of a semiconductor substrate is divided into a plurality of element regions by field insulation layers, and memory cells are formed in the element regions thus divided. Of course, the memory cells are electrically insulated from each other by the field insulation layer.

An erasable and programmable read only memory (EPROM) comprises a p-channel floating gate MOS transistor acting as a memory cell as shown in, for example, FIG. 1. In the prior art shown in FIG. 1, a field insulation layer 10 is formed on an n-type semiconductor substrate 12. It is seen that an n+-type region 14 is formed in the substrate 12 right under the field insulation layer 10. P+-type regions 16A, 16B acting as source and drain regions are formed in contact with the p+-type region 14 within an element region surrounded by the field insulation layer 10. The element region is covered with an insulation layer 18. It is seen that a floating gate electrode 20 is formed on the channel region positioned between the p+-type regions 16A and 16B with the insulation layer 18 interposed between the electrode 20 and the channel region. Also, a control gate 22 is formed on the floating gate electrode 20 with an insulation layer interposed therebetween. Further, an insulation layer 24 is formed to cover the control gate electrode 22, floating gate electrode 20 and field insulation layer 10. Still further, source and drain electrodes 26A, 26B are formed in ohmic contact with the p+-type regions 16A, 16B via contact holes made through the insulation layers 24 and 18 superposed one upon the other.

The n+-type region 14 shown in FIG. 1 is intended to prevent the conductivity type of the substrate 12 from being inverted into a p-type in the region directly under the field insulation layer 10 by the stationary charge of the field insulation layer 10 and the electric field produced by the wiring (not shown) formed on the insulation layer 24. If the inversion occurs, a short-circuit current flows between the p+-type regions 16A, 16B and the other element regions.

Where the floating gate MOS transistor is used as a memory cell, such a large potential difference as −20 V or more with respect to the source electrode and substrate is applied to the gate electrode and drain electrode during the programming operation in order to generate hot holes between the p+-regions 16A and 16B for charging the floating gate electrode 20. The voltage applied to the p+-type region 16B can be maintained within a range which does not exceed the breakdown voltage in the reverse direction of the pn junction formed between the p+-region 16B and the n+-region 14. In the MOS transistor shown in FIG. 1, the breakdown voltage in the reverse direction of the pn junction mentioned above greatly depends on the impurity concentration of the n+-type region 14, because the impurity concentration of the p+-type region 16B is set at $10^{20}$ cm$^{-3}$ or more in order to reduce the wiring resistance and because the impurity concentration of the n+-type region 14 is higher than that of the substrate 12. Since a voltage of 20 V is applied to the pn junction formed between the p+-type region 16B and the n+-type region 14, the upper limit of the impurity concentration of the n+-type region 14 may be about $5 \times 10^{16}$ cm$^3$.

On the other hand, the field insulation layer 10 tends to be thin in accordance with miniaturization of the memory cell. As a result, the conductivity type of the n+-type region 14 right under the field insulation layer 10 is more likely to be inverted. The inversion of the conductivity type can be prevented by increasing the impurity concentration of the n+-type region 14. However, the increase in the impurity concentration results in a lowered breakdown voltage in the reverse direction of the pn junction between the n+-type region 14 and the p+-type region 16B. If the impurity concentration of the n+-type region 14 exceeds the upper limit mentioned above, it is impossible to apply a voltage of 20 V to the p+-type region 16B. It follows that the construction of the memory cell (or floating gate MOS transistor) shown in FIG. 1 is unsuitable for increasing the degree of integration of the memory device.

A memory cell as shown in FIG. 2 is also known to the art. The cell shown in FIG. 2 is equal to that shown in FIG. 1 except that, in FIG. 2, a p−-type region 28 is formed in contact with both the n+-type region 14 and the p+-type region 16B within the element region surrounded by the field insulation layer 10. In the prior art of FIG. 2, the pn junction formed between the p−-type region 28 and the n+-type region 14 exhibits a relatively high breakdown voltage in the reverse direction because the p−-type region 28 has a low impurity concentration, compared with the p+-type region 16B.

However, the conventional method of producing the memory cell shown in FIG. 2 makes it necessary to employ an impurity diffusion step (or ion implantation step) twice for forming the p+-type region 16B and the p−-type region 28. In addition, the material used as a mask pattern in the impurity diffusion step must be subjected to a patterning treatment. What should be noted is that it is necessary to take a masking error into consideration. Particularly, the p−-type region 28 is positioned outside the p+-type region 16B in the memory cell of FIG. 2, with the result that the cell shown in FIG. 2 requires an element region larger than that in FIG. 1.

A memory cell shown in FIG. 3 is also known to the art. The cell shown in FIG. 3 is equal to that shown in FIG. 1 except that, in FIG. 3, an n-type region 29 is formed directly under the field insulation layer 10 in contact with both the p+-type region 16B and the n+-type region 14. In FIG. 3, the element region need not be larger than in FIG. 1. However, an impurity diffusion step must be carried out twice in the construction of FIG. 3 for forming the n−-type region 29 and the n+-type region 14.

SUMMARY OF THE INVENTION

An object of the present invention is to provide a method of producing a semiconductor device which permits forming low and high impurity regions for electrically insulating a prescribed element region formed within a semiconductor substrate from other element regions. The method of the present invention makes it possible to decrease the number of steps required for forming the low and high impurity regions, thereby increasing yield and decreasing manufacturing costs. Also, the density of integration within the substrate is not lowered by the formation of the particular impurity regions.

According to the present invention, there is provided a method of producing a semiconductor device, comprising a first step of forming an oxidation resistant film pattern on a prescribed element region formed in a semiconductor substrate of a first conductivity type; a second step of applying an anisotropic etching to the substrate with the oxidation resistant film pattern used as a mask to form an inclined portion surrounding the element region and a flat portion in contact with the lower end of the inclined portion; a third step of forming a covering layer of a prescribed thickness on the inclined and flat portions; and a fourth step of introducing by ion implantation an impurity of the first conductivity type through the covering layer into the substrate, said impurity being implanted in a direction substantially perpendicular to the flat portion to form first and second regions of the first conductivity type in the substrate.

In the present invention, an inclined portion is formed to surround an element region. Also formed is a flat portion in contact with the lower end of the inclined portion. In the subsequent ion implantation step, the impurity ions run through the covering layer. The distance run by the ions through the covering layer is equal to the thickness of the covering layer when it comes to the impurity ions introduced into the flat portion. However, the ions introduced into the inclined portion must run through the covering layer by a distance greater than the thickness of the covering layer. It follows that the number of impurity ions reaching the substrate near the inclined portion is smaller than that of impurity ions reaching the substrate near the flat portion. In other words, it is possible to form first and second regions of the first conductivity type differing from each other in the impurity concentration by a single step. The element region is surrounded by the resultant first region of a low impurity concentration which is in contact with the second region. Where a high impurity region of a second conductivity type is formed within the element region in contact with the first region, the pn junction formed between the first region and the high impurity region exhibits a high breakdown voltage in the reverse direction.

BRIEF DESCRIPTION OF THE DRAWINGS

FIGS. 4A to 4H are cross sectional views collectively showing a method of producing a floating gate MOS transistor according to one embodiment of the present invention;

DETAILED DESCRIPTION OF THE PREFERRED EMBODIMENTS

Figure 1:
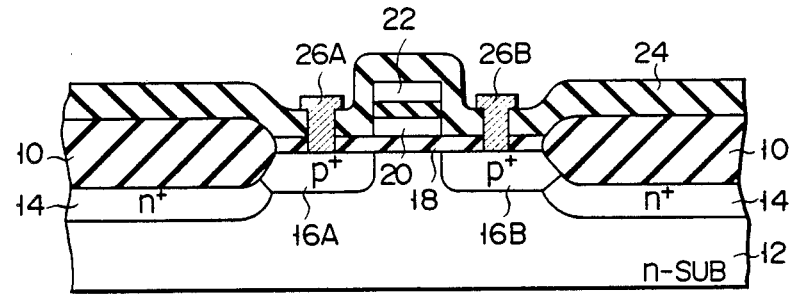
FIG. 1 is a cross sectional view showing a memory cell of the conventional EPROM.
Figure 2:
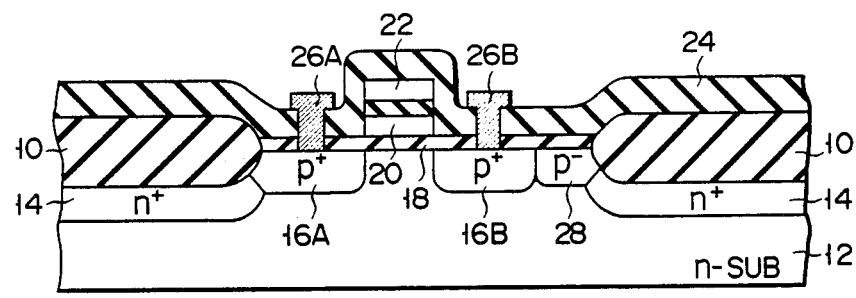
FIG. 2 is a cross sectional view showing a memory cell of the conventional EPROM resembling the cell shown in FIG. 1, except that the p+-type drain region is in contact with a p−-type region.
Figure 3:
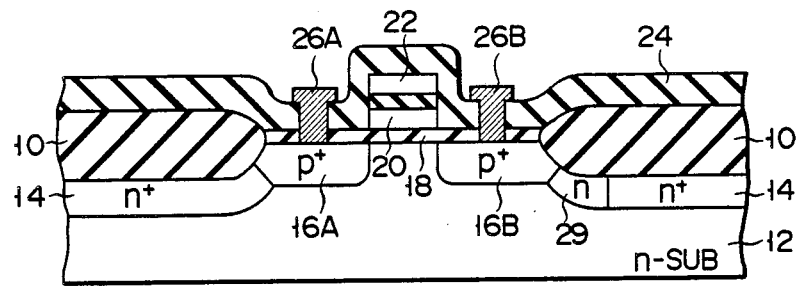
FIG. 3 is a cross sectional view showing a memory cell of the conventional EPROM resembling the cell shown in FIG. 1, except that an n−-type region is formed in contact with the p+-type drain region.
Figure 4D:
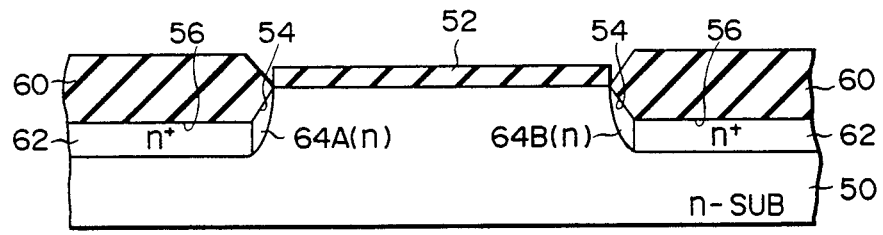

FIGS. 4A to 4H collectively show a method according to one embodiment of the present invention. This embodiment is directed to the production of a p-channel floating gate MOS transistor used as a memory cell of EPROM. In the first step, a silicon nitride pattern 52 is formed on a n-type silicon substrate 50 with a buffer oxide film (not shown) interposed therebetween, as shown in FIG. 4A. Then, an anisotropic etching is applied to the substrate 50 with the nitride pattern 52, which is resistant to oxidation, used as a mask to form an inclined portion 54 along the periphery of the mask 52 and a flat portion 56 in contact with the lower end of the inclined portion 54. An anisotropic etchant such as KOH is used in this etching step. The inclined portion 54 makes an angle of about 60° (i.e., $\theta = 120°$) with the flat portion 56. After the etching step, a $SiO_2$ film 58 is formed by CVD in a uniform thickness of, for example, 200 Å to cover the inclined portion 54, flat portion 56 and silicon nitride pattern 52, as shown in FIG. 4B.

Then, an n-type impurity, e.g., arsenic, is introduced through the $SiO_2$ film 58 into the substrate 50 by means of ion implantation at a dose of $4 \times 10^{13}$ cm$^{-2}$. The ions, which are accelerated to have an energy of 100 keV, are implanted in a direction perpendicular to the $SiO_2$ film 58. In general, the accelerated arsenic ions are capable of running a distance of about 340 Å within a $SiO_2$ layer, with the result that the implanted arsenic ions are distributed within the $SiO_2$ layer to form substantially a Gaussian distribution about the point of 340 Å as a center from the surface of the $SiO_2$ layer. In this embodiment, the arsenic ions running toward the inclined portion 54 must travel a distance of 400 Å, i.e., 200 Å $\times$ sec 60°, within the $SiO_2$ layer 58 before reaching the substrate 50. However, it suffices for the ions running toward the flat portion 56 to cross the $SiO_2$ layer 58 in its thickness direction, i.e., a distance of 200 Å, for reaching the substrate 50. It follows that substantially all the arsenic ions running toward the flat portion 56 are capable of passing through the $SiO_2$ layer 58 to reach the substrate 50. However, the majority of the ions running toward the inclined portion 54 are incapable of passing through the $SiO_2$ layer 58. As a result, the impurity concentration near the flat portion 56 is given about 100 times as high as that near the inclined portion 54.

After the ion implantation step, a thermal oxidation treatment is applied to the substrate 50 under a wet atmosphere of 1000° C. with the silicon nitride pattern 52 used as an oxidation resistant mask so as to form a field insulation layer 60 having a thickness of 6000 Å. As shown in FIG. 4D, both the inclined portion 54 and the flat portion 56 are covered with the field insulation layer 60. During the thermal oxidation step, the arsenic ions within the substrate 50 are activated to form an n+-type region 62 having an impurity concentration of about $2 \times 10^{17}$ cm$^{-3}$ below the flat portion 56. At the same time, n-type regions 64A, 64B having an impurity concentration of $1\times10^{15}$ cm$^{-3}$ are formed below the inclined portion 54.

Figure 4E:
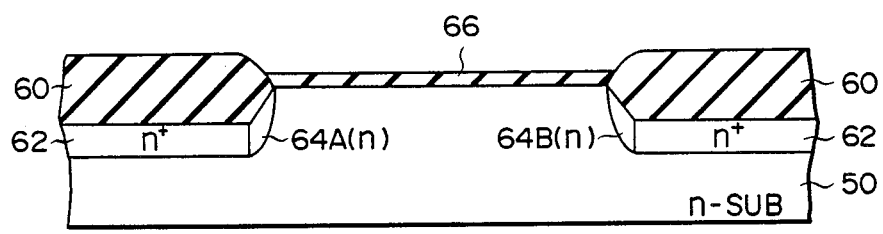

In the next step, after the silicon nitride pattern 52 on the element region surrounded by the field insulation layer 60 and the buffer oxide film (not shown) positioned below the nitride pattern 52 are removed, a thermal oxidation treatment to the exposed surface of the element region is applied to form a thermal oxide film 66 having a thickness of 200 Å as shown in FIG. 4E.

Figure 4F:
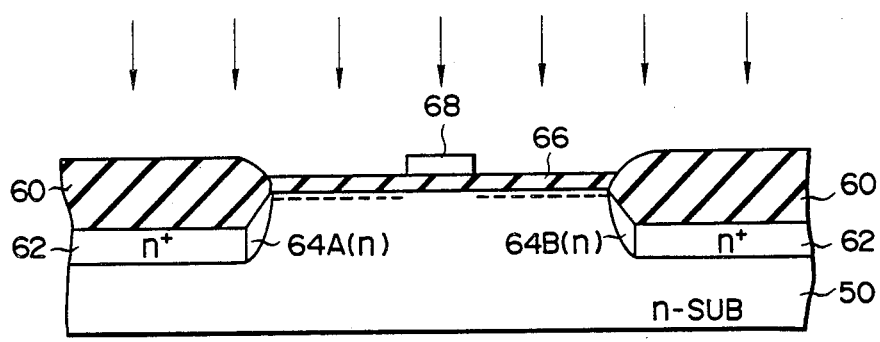
Figure 4G:
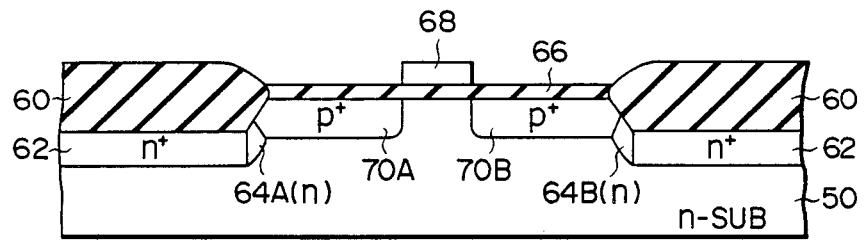

Further, a polycrystalline silicon (poly-Si) film doped with phosphorus and having a thickness of 3000 Å is formed by CVD on the entire surface, followed by patterning the poly-Si film to form a floating gate electrode 68, as shown in FIG. 4F. It should be noted that the thermal oxide film 66 is so thin as to be generally removed in the patterning step of the poly-Si layer except for the portion below the floating gate electrode 68, though the film 66 is shown unremoved in the drawings. After formation of the floating gate electrode 66, a p-type impurity, e.g., boron, is introduced by ion implantation into the substrate 50 at a dose of $1\times10^{15}$ cm$^{-2}$ and an energy of 40 KeV. In this ion implantation step, the floating gate electrode 66 acts as a mask. The boron ions implanted into the substrate 50 are activated by a heat treatment or by a lamp annealing to form p$^+$-type regions 70A, 70B acting as source and drain regions, as shown in FIG. 4G.

Figure 4H:
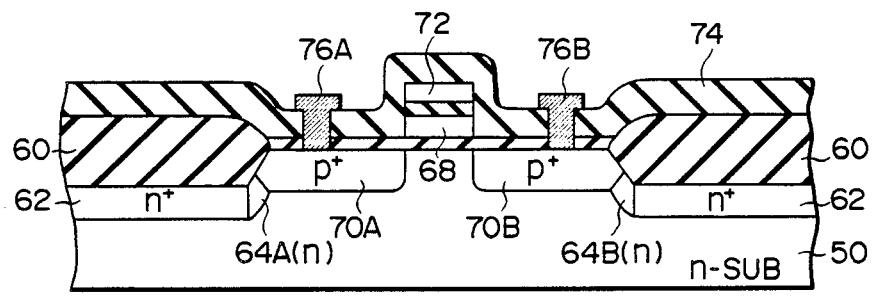

Further, a control gate 72 of poly-Si doped with phosphorus is formed on the floating gate electrode 68 with an oxide film interposed therebetween as shown in FIG. 4H. Still further, a CVD SiO$_2$ film 74 is formed to cover both the field oxide layer 60 and the element region, with the result that the control gate 72 and the floating gate electrode 68 are insulated from the outside. The SiO$_2$ film 74 is provided with contact holes and, then, an aluminum layer (not shown) is deposited on the SiO$_2$ film 74. It follows that the aluminum layer is brought into contact with the p$^+$-type regions 70A, 70B via the contact holes. Finally, the aluminum layer is selectively removed to form source and drain electrodes 76A, 76B.

In the embodiment described above, the p$^+$-type regions 70A, 70B are in contact with n-type regions 64A, 64B having a relatively low impurity concentration, with the result that the pn junction formed therebetween exhibits a high breakdown voltage in the reverse direction. Thus, it is possible to further reduce the thickness of the field insulation layer 60, with the source and drain voltage kept at a sufficiently high level. Also, the angle of inclination of the inclined portion 54 may be set at about 60°, with the result that the wiring pattern is less likely to be broken at the boundary between the inclined portion 54 and the field insulation layer 60.

It is particularly important to note that an impurity is introduced by means of ion implantation into the substrate 50 via the SiO$_2$ film 58 of a uniform thickness covering both the inclined portion 54 and the flat portion 56 as shown in FIG. 4C. Naturally, the impurity concentration below the inclined portion 54 is made markedly lower than that below the flat portion 56 as described previously. In other words, impurity regions of the same conductivity type having high and low impurity concentrations, i.e., the n-type regions 64A, 64B and n$^+$-type region 62, can be formed in a single step in the present invention, leading to a low manufacturing cost of the floating gate MOS transistor (or memory cell). Further, the method of the present invention makes it possible to sufficiently ensure a high reliability of the memory cell and to increase the degree of integration of the memory device.

The SiO$_2$ film 58 formed in the step shown in FIG. 4B is very important in the present invention. For example, an n-type region and an n$^+$-type region may be formed in mutual contact in the surface area of the substrate 50 in the step of FIG. 4C which is carried out immediately after the step of FIG. 4A with the step of FIG. 4B omitted. If the n-type impurity is implanted in a direction perpendicular to the flat portion 56 in the step of FIG. 4C, the ratio of impurity concentration of the n-type region to the n$^+$-type region is determined by the angle of inclination of the inclined portion 54. In order to obtain a concentration ratio of, for example, 1:10, the inclined portion 54 must be inclined at an angle of about 84°. If the desired concentration ratio is 1:100, the angle of inclination must be about 89°. What should be noted is that the impurity concentration ratio is so markedly affected by a small difference in the inclination of the inclined portion 54 that it is difficult to set the inclination as desired in order to obtain a desired concentration ratio. Also, even if the inclined portion 54 is formed to have a desired inclination, a great stress is applied to the boundary between the flat portion 56 and the inclined portion 54 when the inclined portion 54 is thermally oxidized in the subsequent step to form the field insulation layer 60. It follows that the crystals at the boundary region are strained, leading to deterioration in the element performance. For example, the leakage current of the element is increased. Also, the strain of the crystal promotes the growth of the field insulation layer 60 in the lateral direction, resulting in failure to increase the degree of integration of the memory device.

Under the circumstances, it is absolutely necessary to carry out the step of FIG. 4B before the step of FIG. 4C. Specifically, if the SiO$_2$ film 58 is formed in the step shown in FIG. 4B, it is possible to set the angle of inclination of the inclined portion 54 at about 60° in the step of FIG. 4A so as to overcome the problems given above.

Figure 5:
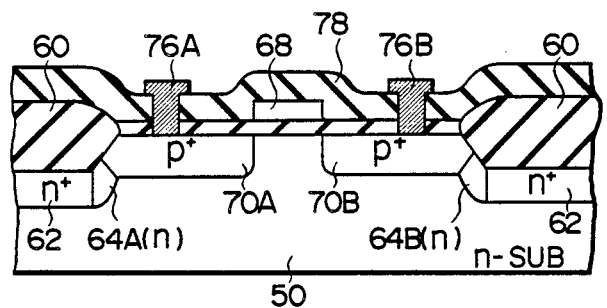
FIG. 5 is a cross sectional view showing an insulation gate MOS transistor produced by a method according to a second embodiment of the present invention.

The method of the present invention may also be employed for the manufacture of an insulated gate MOS transistor as shown in, for example, FIG. 5 with substantially the same effects. In the manufacture of the MOS transistor shown in FIG. 5, an insulation layer 78 is formed after the step shown in FIG. 4G without forming the gate electrode 72 shown in FIG. 4H. It is seen that the insulation layer 78 is formed to cover the gate electrode 64 on the field insulation layer 60 and the element region. Generally, an insulated gate MOS transistor acting as a peripheral circuit of the memory cell is included in an EPROM. Thus, the insulated gate MOS transistor shown in FIG. 5 can be efficiently formed by the step common with the step of FIG. 4H for forming a memory cell (i.e., floating gate MOS transistor). On the other hand, the MOS transistor shown in FIG. 5 can also be utilized independently as an element of a high voltage circuit.

Figure 6:
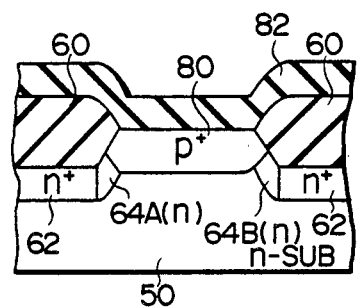
FIG. 6 is a cross sectional view showing a semiconductor device produced by a method according to a third embodiment of the present invention, said device being used for applying a high voltage to a MOS transistor as shown in, for example, FIGS. 4H or 5.

The method of the present invention can also be employed for the manufacture of a semiconductor device shown in FIG. 6, e.g., a memory cell of an EPROM and a semiconductor device for supplying a high voltage to the peripheral circuit of the memory cell. For producing a semiconductor device of this type, an ion implantation and annealing are performed in the step of FIG. 4F without forming the gate electrode 68 to form a p$^+$-type region 80 within the element region.

Then, an insulation layer 82 is formed to cover the field insulation layer 60 and the element region to protect the surface of the p+-type region 80.

In the embodiments described above, the SiO$_2$ film 58 for controlling the ion implantation is formed by CVD. However, the film 58 may be formed of another material, e.g., Si$_3$N$_4$. Also, the film 58 may be formed by directly oxidizing or nitriding the flat portion 56 and the inclined portion 54. Also, the semiconductor substrate is of n-type in the embodiments described above. However, it is of course possible to reverse the conductivity type of the substrate, though the conductivity type of each element region should also be reversed in this case. Further, the silicon substrate 50 used in the embodiments described above may be replaced by another semiconductor substrate, e.g., by Ge or GaAs substrate.

What is claimed is:

1. A method of producing a semiconductor device, comprising the steps of:
   (1) forming a film pattern on a semiconductor substrate of a first conductivity type to define a masked surface as an element region;
   (2) anisotropically etching the substrate with said film pattern as used as a mask to form a recess having a flat bottom and inclined side in a peripheral region surrounding said element region, said inclined side being located between the flat bottom and the masked surface of said element region and being disposed at a predetermined angle relative to the flat bottom;
   (3) forming a covering layer on said flat bottom and inclined side, said covering layer having a uniform thickness;
   (4) implanting impurity ions of the first conductivity type into the substrate through the covering layer in a direction substantially perpendicular to said flat bottom;
   (5) forming a field insulation layer on said flat bottom and inclined side and diffusing the implanted impurity ions in the substrate to form first and second regions of the first conductivity type immediately below the respective flat bottom and inclined side, said first and second regions having different impurity concentrations as determined by said predetermined angle; and
   (6) forming, in said element region, a third region of a second conductivity type in contact with said second region.

2. A method according to claim 1, wherein the film pattern formed in stap (1) is resistant to oxidation, and said step (5) includes a first substep of removing said covering layer from said flat bottom and inclined side and a second substep of thermally oxidizing said ion-implanted substrate under a wet atmosphere with the film pattern used as a mask, said ion-implanted substrate being annealed during the second substep.

3. A method according to claim 1, wherein said step (6) includes a first substep of removing said film pattern to expose the element region, a second substep of implanting impurity ions of the second conductivity type into the substrate with said field insulation layer used as a mask, and a third substep of annealing the ion-implanted substrate, thereby forming said third region.

4. A method according to claim 1, wherein said step (6) includes a first substep of removing said film pattern to expose said element region, a second substep of forming a gate insulation layer on said element region and forming a gate electrode on said gate insulation layer, a third substep of implanting impurity ions of a second conductivity type into the substrate with said field insulation layer and gate electrode used as a mask, and a fourth substep of annealing the ion-implanted substrate, thereby forming source and drain regions as said third regions.

5. A method according to claim 4, wherein said step (6) further includes a fifth substep of forming a second gate insulation layer on the first gate electrode and forming a second gate electrode on said second gate insulation layer, and a sixth substep of forming a protecting layer on said source and drain regions and first and second gate electrodes.

6. A method according to claim 1, wherein said step (3) includes a first substep of depositing silicon oxide on said flat bottom and inclined side by CVD.

7. A method according to claim 1, wherein said step (3) includes a first substep of depositing silicon nitride on said flat bottom and inclined side by CVD.

8. A method according to claim 1, wherein said step (3) includes a first substep of oxidizing the flat bottom and inclined side.

9. A method according to claim 1, wherein said step (3) includes a first substep of nitriding the flat bottom and inclined side.

10. A method according to claim 1, wherein said semiconductor substrate is formed of silicon.

11. A method according to claim 1, wherein said semiconductor substrate is formed of germanium.

12. A method according to claim 1, wherein said semiconductor substrate is formed of gallium arsenide.

* * * * *